US012792812B2

(12) United States Patent
Qian

(10) Patent No.: US 12,792,812 B2
(45) Date of Patent: Nov. 10, 2026

(54) SYSTEMS AND METHODS FOR AUTOMATIC IDENTIFICATION AND CONNECTION OF INTERCONNECT WIRE SEGMENTS OF THE SAME NET WITHIN A PRE-DEFINED ROUTING REGION VIA A GRAPHIC-BASED LAYOUT EDITOR

(71) Applicant: Skillcad, Inc., San Jose, CA (US)

(72) Inventor: Pengwei Qian, San Jose, CA (US)

(73) Assignee: Skillcad, Inc., San Jose, CA (US)

( * ) Notice: Subject to any disclaimer, the term of this patent is extended or adjusted under 35 U.S.C. 154(b) by 696 days.

(21) Appl. No.: 18/234,211

(22) Filed: Aug. 15, 2023

(65) Prior Publication Data

US 2024/0070368 A1 Feb. 29, 2024

Related U.S. Application Data

(60) Provisional application No. 63/402,320, filed on Aug. 30, 2022.

(51) Int. Cl.
*G06F 30/392* (2020.01)
*G06F 30/31* (2020.01)

(52) U.S. Cl.
CPC ............ *G06F 30/392* (2020.01); *G06F 30/31* (2020.01)

(58) Field of Classification Search
CPC ............................... G06F 30/392; G06F 30/31
USPC .......................................................... 716/139
See application file for complete search history.

(56) References Cited

U.S. PATENT DOCUMENTS 8,028,258 B1 * 9/2011 Ogami .................... G06F 30/39 716/121
12,547,810 B1 * 2/2026 Ho ........................ G06F 30/392
2002/0040466 A1 * 4/2002 Khazei .................. G06F 30/367 716/115
2002/0162081 A1 * 10/2002 Solomon ................. G06T 19/00 716/119
2007/0198960 A1 * 8/2007 Fotakis ................... G06F 30/39 716/129
2011/0219352 A1 * 9/2011 Majumder ............. G06F 30/00 716/139
2014/0019930 A1 * 1/2014 Yuh ......................... G06F 30/30 716/115
2018/0321824 A1 * 11/2018 Qian ....................... G06F 30/31
2023/0205969 A1 * 6/2023 Surendran ........... G06F 30/3312 716/52

(Continued)

*Primary Examiner* — Suresh Memula

(57) ABSTRACT

An approach is proposed to support automatic same net interconnect wire segment identification and connection in a circuit layout. A layout editing tool presents the circuit layout on a display to a user and recognizes an action by the user at a specific point in the circuit layout to identify a first interconnect wire segment. The layout editing tool identifies a pre-defined routing region that includes or is the closest to the point of the user action in the circuit layout as well as a first set of interconnect wire segments that intersect with the pre-defined routing region and belong to the same net. The layout editing tool automatically creates and routes a second set of interconnect wire segments within the pre-defined routing region, wherein each interconnect wire segment in the second set of interconnect wire segments connects two or more interconnect wire segments in the first set together.

20 Claims, 6 Drawing Sheets

(56) References Cited

U.S. PATENT DOCUMENTS

2024/0211674 A1* 6/2024 Pihl ........................ G06F 30/39
2024/0265182 A1* 8/2024 Li ........................ G06F 30/392

* cited by examiner

SYSTEMS AND METHODS FOR AUTOMATIC IDENTIFICATION AND CONNECTION OF INTERCONNECT WIRE SEGMENTS OF THE SAME NET WITHIN A PRE-DEFINED ROUTING REGION VIA A GRAPHIC-BASED LAYOUT EDITOR

CROSS-REFERENCE TO RELATED APPLICATIONS

This application claims the benefit of U.S. Provisional Patent Application No. 63/402,320, filed Aug. 30, 2022, which is incorporated herein in its entirety by reference.

BACKGROUND

A graphic-based layout editing tool/editor is software running on a hosting device or host, wherein the graphic-based layout editor presents a layout of a circuitry, such as an integrated circuit (IC) design to a user/IC designer on a display screen. The graphic-based layout editor enables the user to interactively generate and edit the layout of the IC via one or more input devices. Typically, the layout of the IC includes hundreds or even thousands of layout objects of various shapes and sizes, including but not limited to functional blocks (or blocks/modules/cells) and interconnect wire segments of nets connecting pins transmitting input and/or output signals into and/or out of each of the functional blocks. Each of the functional blocks comprises a plurality (e.g., many thousands) of gates and transistors to perform certain functions of the IC. Each net includes a plurality of interconnect wire segments routed in horizontal, vertical, or any other direction through the layout. In some embodiments, the interconnect wire segments can be routed on different routing layers of one or more types of materials, e.g., metal and/or polysilicon layers wherein the interconnect wire segments of the same net routed on different routing layers can be connected by one or more vias between the layers. In some embodiments, the interconnect wire segments are constrained to be routed within one or more pre-defined routing regions in the layout, wherein each of the pre-defined routing regions has one or more tracks of certain width, spacing and pattern (WSP), wherein the pattern includes but is not limited to one or more properties and/or masks for a certain routing layer.

Under certain scenarios, a first set of interconnect wire segments belonging to the same net, e.g., identified or marked by the same net identification no. or id, need to be connected together via a second set of interconnect wire segments. For a non-limiting example, the first set of interconnect wire segments may be currently routed in parallel with each other on one metal layer in one direction (e.g., horizontal or vertical), while the second set of interconnect wire segments needs to be routed on another metal layer in a different direction (e.g., vertical or horizontal) and connected with the first set of interconnect wire segments through a plurality of vias. To generate and route the second set of interconnect wire segments, the user currently needs to first identify the first set of interconnect wire segments to be connected as well as one of the pre-defined routing regions in the layout and then manually create and route each of the second set of interconnect wire segments connecting two interconnect wire segments in the first set of interconnect wire segments with vias within the identified pre-defined routing region. Such manual routing process, however, can be very repetitive and become time consuming, especially when the number of interconnect wire segments in the first set that need to be connected is large.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EMBODIMENTS

Figure 1:
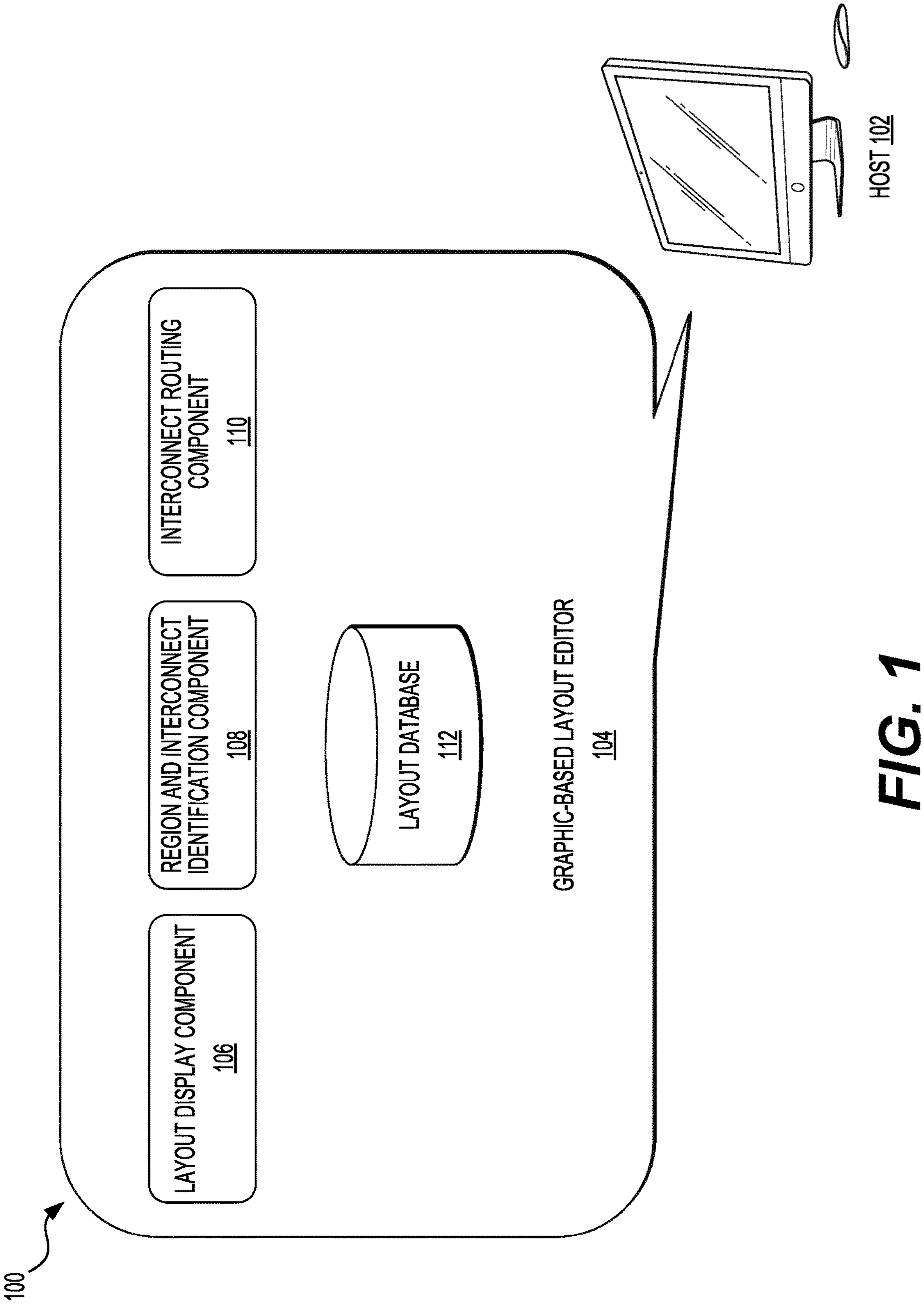
FIG. 1 depicts an example of a diagram of a system to support automatic same net interconnect wire segment identification and connection in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A new approach is proposed that contemplates systems and methods to support automatic same net interconnect wire segment identification and connection in a circuit layout via a graphic-based layout editing tool running on a host. The graphic-based layout editing tool first presents the circuit layout on a display to a user and recognizes an action by the user via an input device, e.g., a mouse, at a specific point in the circuit layout to identify a first interconnect wire segment. The graphic-based layout editing tool then identifies a pre-defined routing region that includes or is the closest to the point of the user action in the circuit layout, as well as a first set of interconnect wire segments (including the first interconnect wire segment) that intersect with the pre-defined routing region and belong to the same net as the first interconnect wire segment. Once the first set of interconnect wire segments has been identified, the graphic-based layout editing tool is configured to automatically create and route a second set of interconnect wire segments within the pre-defined routing region, wherein each interconnect wire segment in the second set of interconnect wire segments connects two or more interconnect wire segments in the first set of interconnect wire segments together using one or more vias.

Under the proposed approach, the graphic-based layout editing tool enables the user to identify and connect the first set of interconnect wire segments that belong to the same net automatically without human intervention. The connection is confined to a specific pre-defined routing region in the layout, wherein routing of the interconnect wire segments connecting the first set of interconnect wire segments follows various WSP constraints of the pre-defined routing region. As such, the proposed graphic-based layout editing tool performs automatic same net interconnect wire segment identification and connection without the user having to connect the interconnect wire segments in the first set of interconnect wire segments one pair at a time.

FIG. 1 depicts an example of a diagram of system 100 to support automatic same net interconnect wire segment connection. Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, wherein multiple hosts can be connected by one or more networks.

In the example of FIG. 1, the system 100 includes a graphic-based layout editor/editing tool/editing software 104, wherein the graphic-based layout editor 104 includes at least a layout display component 106, a region and interconnect identification component 108, an interconnect routing component 110, and a layout database 112. Here, the graphic-based layout editor 104 runs on a computing unit/appliance/host 102 having a display, one or more processors, storage units, network interfaces and having software instructions stored in a storage unit, such as a non-volatile memory (also referred to as secondary memory) of the computing unit for practicing one or more processes. When the software instructions are executed, at least a subset of the software instructions is loaded into memory (also referred to as primary memory) by one of the computing units, which becomes a special purposed one for practicing the processes. The processes may also be at least partially embodied in the host into which computer program code is loaded and/or executed, such that, the host becomes a special purpose computing unit for practicing the processes.

In the example of FIG. 1, the host 102 can be a computing device, a communication device, a storage device, or any computing device capable of running a software component. For non-limiting examples, a computing device can be, but is not limited to, a laptop PC, a desktop PC, a tablet PC, or an x86 or ARM-based server running Linux or other operating systems. In some embodiments, the host has a communication interface (not shown), which enables the components and/or the database running on the host to communicate with software running on other host over one or more communication networks (not shown) following certain communication protocols, such as TCP/IP, http, https, ftp, and sftp protocols. The communication networks can be, but are not limited to, internet, intranet, wide area network (WAN), local area network (LAN), wireless network, Bluetooth, WiFi, and mobile communication network. The physical connections of the network and the communication protocols are well known to those of skill in the art.

Figure 2:
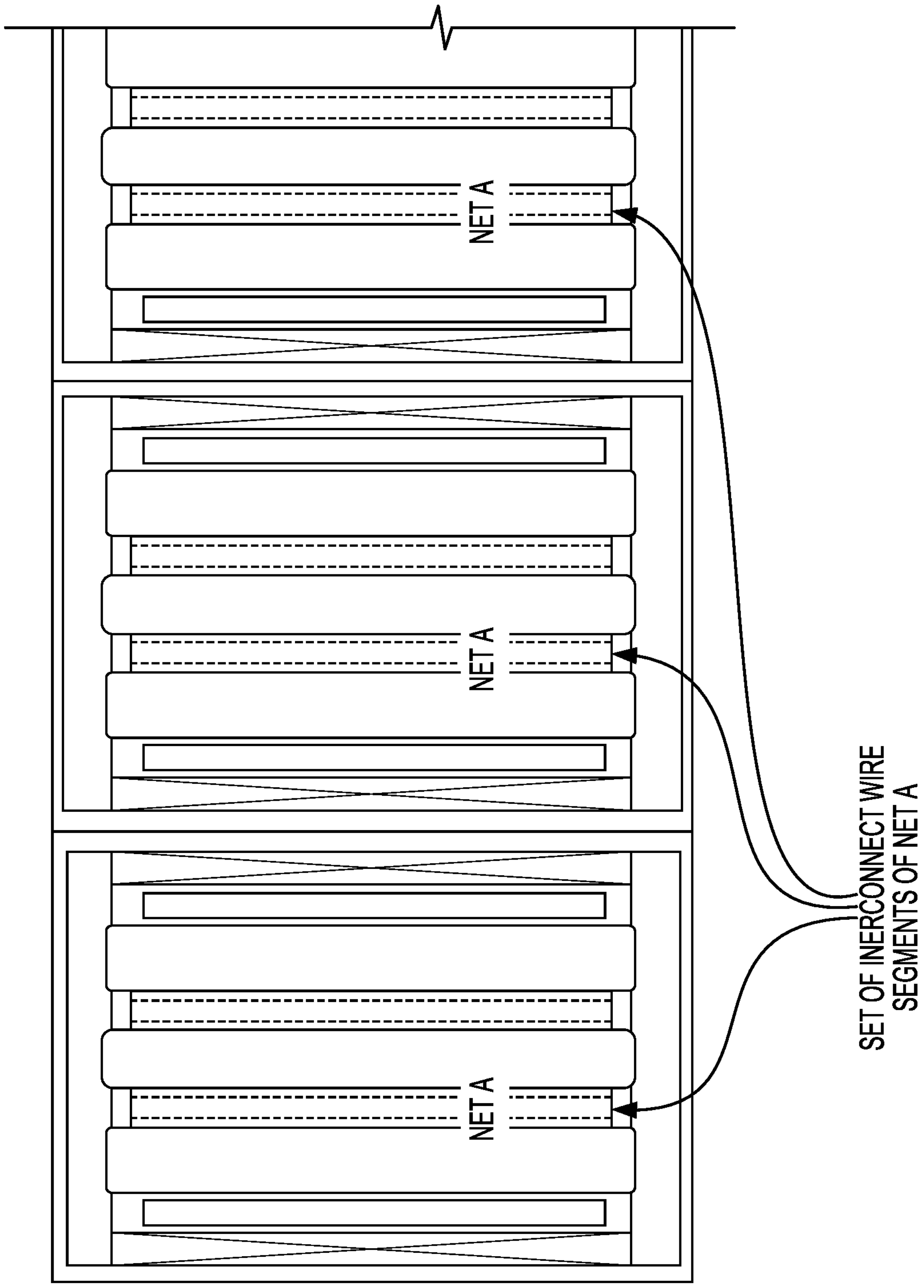
FIG. 2 depicts a non-limiting example of an IC layout having a set of interconnect wire segments that belong to the same net as shown via the layout display component of the graphic-based layout editor in accordance with some embodiments.

In the example of FIG. 1, the layout display component 106 of the graphic-based layout editor 104 is configured to retrieve a circuit layout having a plurality of layout objects, e.g., a plurality of interconnect wire segments, from the layout database 112 and present the circuit layout on a display device for a user to view and edit interactively. Here, the layout database 112 is configured to maintain metadata and/or design rules associated with each of the layout objects, e.g., interconnect wire segments, in the layout as well as other related information of the layout. The metadata associated with each of the layout objects includes one or more of name, number, identification no. or id, and geometric properties of the layout object as well as its connections to other layout objects. For a non-limiting example, the layout database 112 is configured to maintain information of the plurality of interconnect wire segments that belong to each net. For each interconnect wire segment, such information includes but is not limited to, net id/name/number, routing layer, routing direction, starting and end points in the layout, etc. of the each interconnect wire segment. FIG. 2 depicts a non-limiting example of an IC layout having a set of interconnect wire segments that belong to the same net, e.g., Net A, as shown via the layout display component 106 of the graphic-based layout editor 104. As shown by the example of FIG. 2, each of the set of interconnect wire segments has been assigned a net id and the set of interconnect wire segments are currently routed in the same direction parallel to each other on one of the routing layers in the layout.

Figure 3:
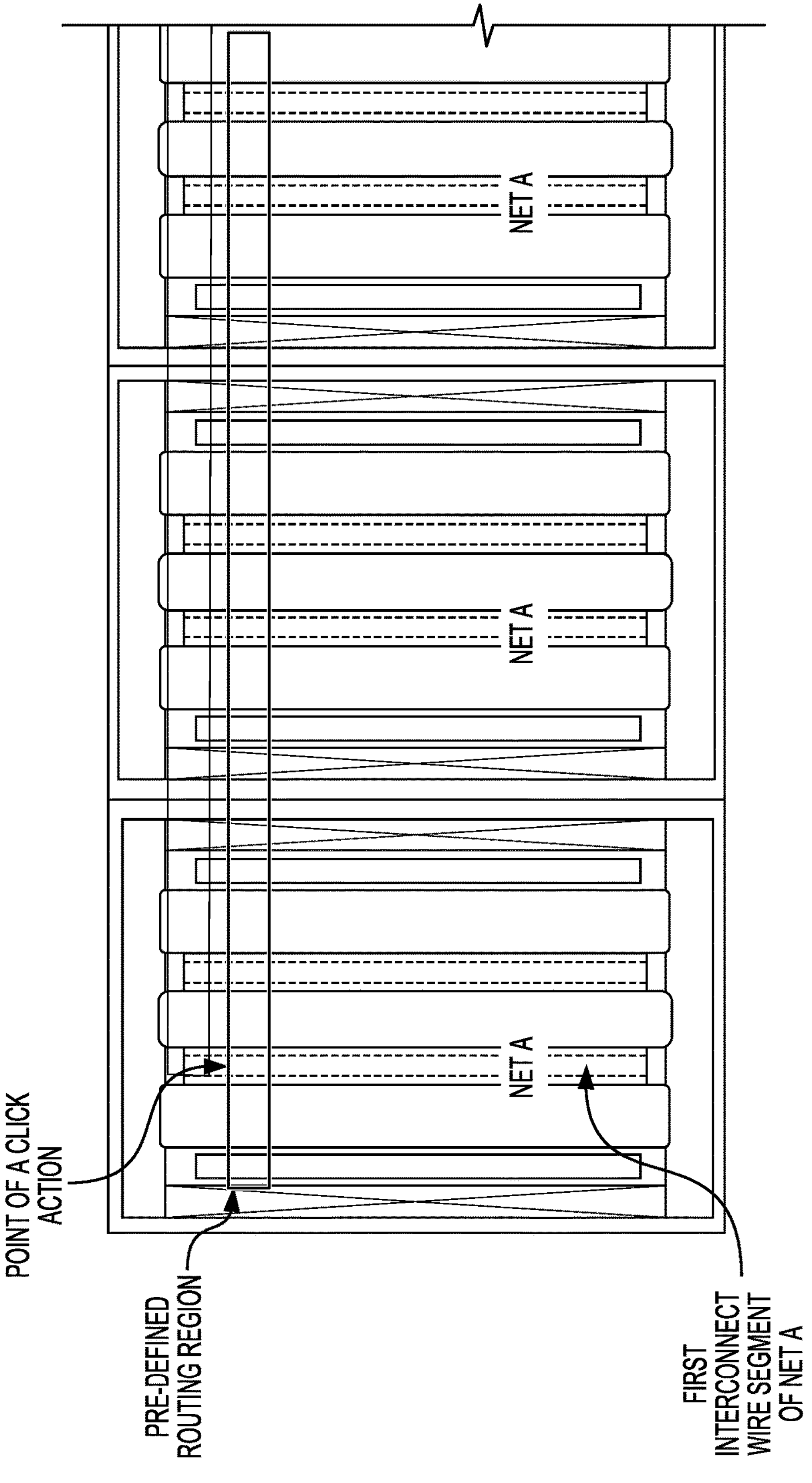
FIG. 3 depicts a non-limiting example of a click action by the user at a specific point the layout by the user that uniquely identifies the first interconnect wire segment of a net as well as a pre-defined routing region in the layout in accordance with some embodiments.

In the example of FIG. 1, the region and interconnect identification component 108 of the graphic-based layout editor 104 is configured to recognize an action initiated by a user, wherein such action is at a specific point/position/location that identifies a first interconnect wire segment of a net in the layout. In some embodiments, the user may initiate the action by a click via an input device (e.g., a mouse) of the host 102 or by moving his/her finger across a touch screen of the host 102. FIG. 3 depicts a non-limiting example of a click action by the user at a specific point the layout by the user that uniquely identifies the first interconnect wire segment of Net A in the layout. In some embodiments, the region and interconnect identification component 108 is further configured to identify a pre-defined routing region that intersects with the first interconnect wire segment based on the specific point of the user action in the layout. Here, the pre-defined routing region includes one or more tracks of certain width, spacing and pattern (WSP), wherein the pattern includes but is not limited to one or more properties and/or masks for a certain routing layer that can be utilized to connect the first interconnect wire segment with the rest of the interconnect wire segments that belong to the same net. If the specific point of the user action is within (included in) one of the pre-defined routing regions in the layout, that specific pre-defined routing region is identified by the region and interconnect identification component 108 as shown by the example of pre-defined routing region #b in FIG. 3. If, on the other hand, the specific point of the user action is not within any of the pre-defined routing regions in the layout, the region and interconnect identification component 108 is configured to identify a pre-defined routing region that is the closest to the specific point of the user action while intersecting with the first interconnect wire segment.

Figure 4:
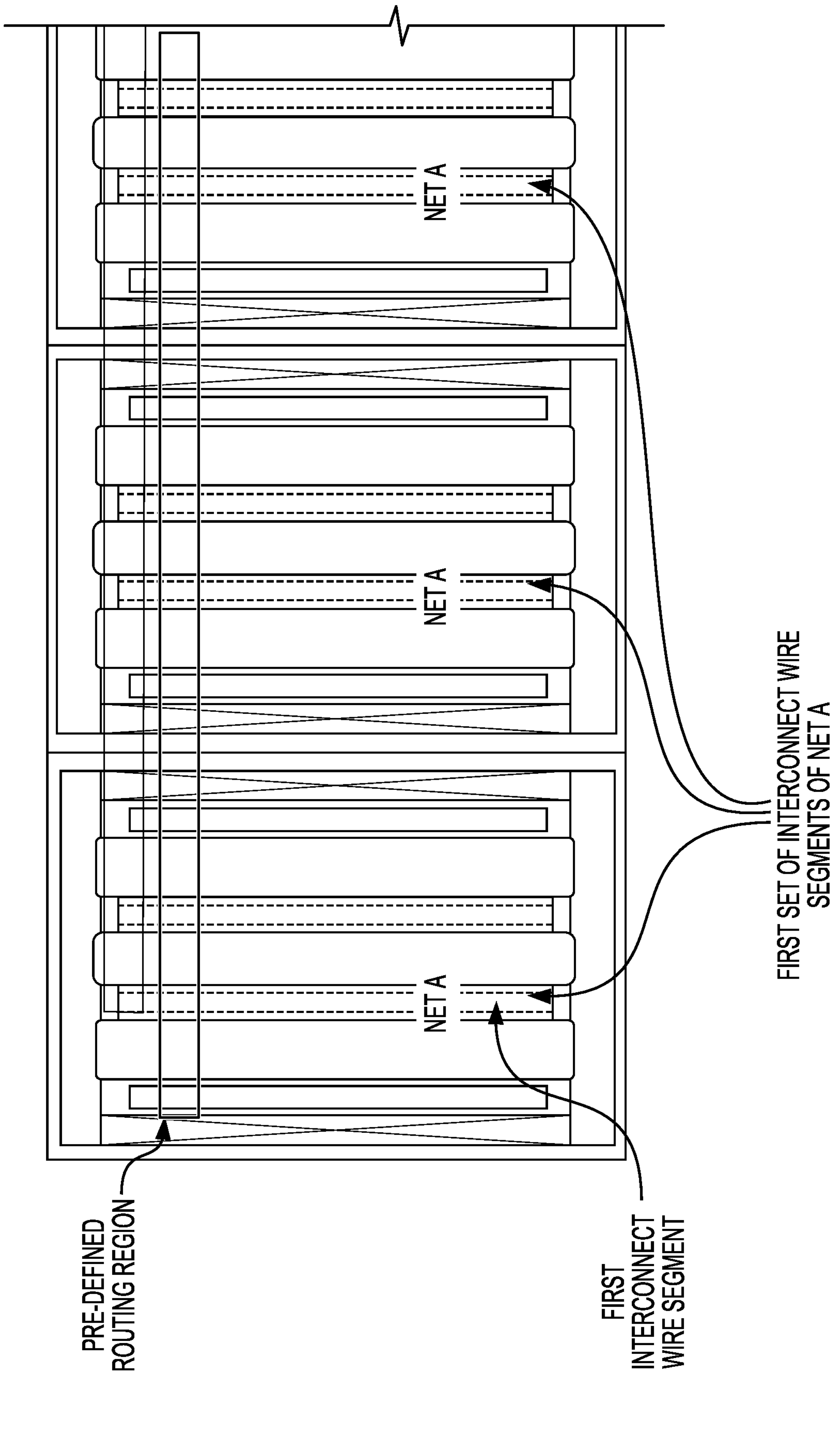
FIG. 4 depicts a non-limiting example of the first set of interconnect wire segments, wherein all interconnect wire segments in the first set of interconnect wire segments, including the first interconnect wire segment, intersect with the pre-defined routing region and are routed in the same direction in the layout in accordance with some embodiments.

Once the pre-defined routing region has been identified, the region and interconnect identification component 108 is configured to identify a first set of interconnect wire segments, wherein each interconnect wire segment in the first set of interconnect wire segments intersects with the pre-defined routing region and belongs to the same net as the first interconnect wire segment, which is also included in the first set of interconnect wire segments for the net. In some embodiments, the region and interconnect identification component 108 is configured to retrieve information, net assignment, and/or location of the first set of interconnect wire segments from the layout database 112. The region and interconnect identification component 108 then utilizes the retrieved information to identify the first set of interconnect wire segments from the same net that intersect with the pre-defined routing region. In some embodiments, the region and interconnect identification component 108 is configured to recognize a directional cursor movement within the re-defined region and identify the first set of interconnect wire segments that intersect with the directional cursor movement. FIG. 4 depicts a non-limiting example of the first set of interconnect wire segments, wherein all interconnect wire segments in the first set of interconnect wire segments including the first interconnect wire segment intersect with the pre-defined routing region #b and are routed in the same direction in the layout.

Figure 5:
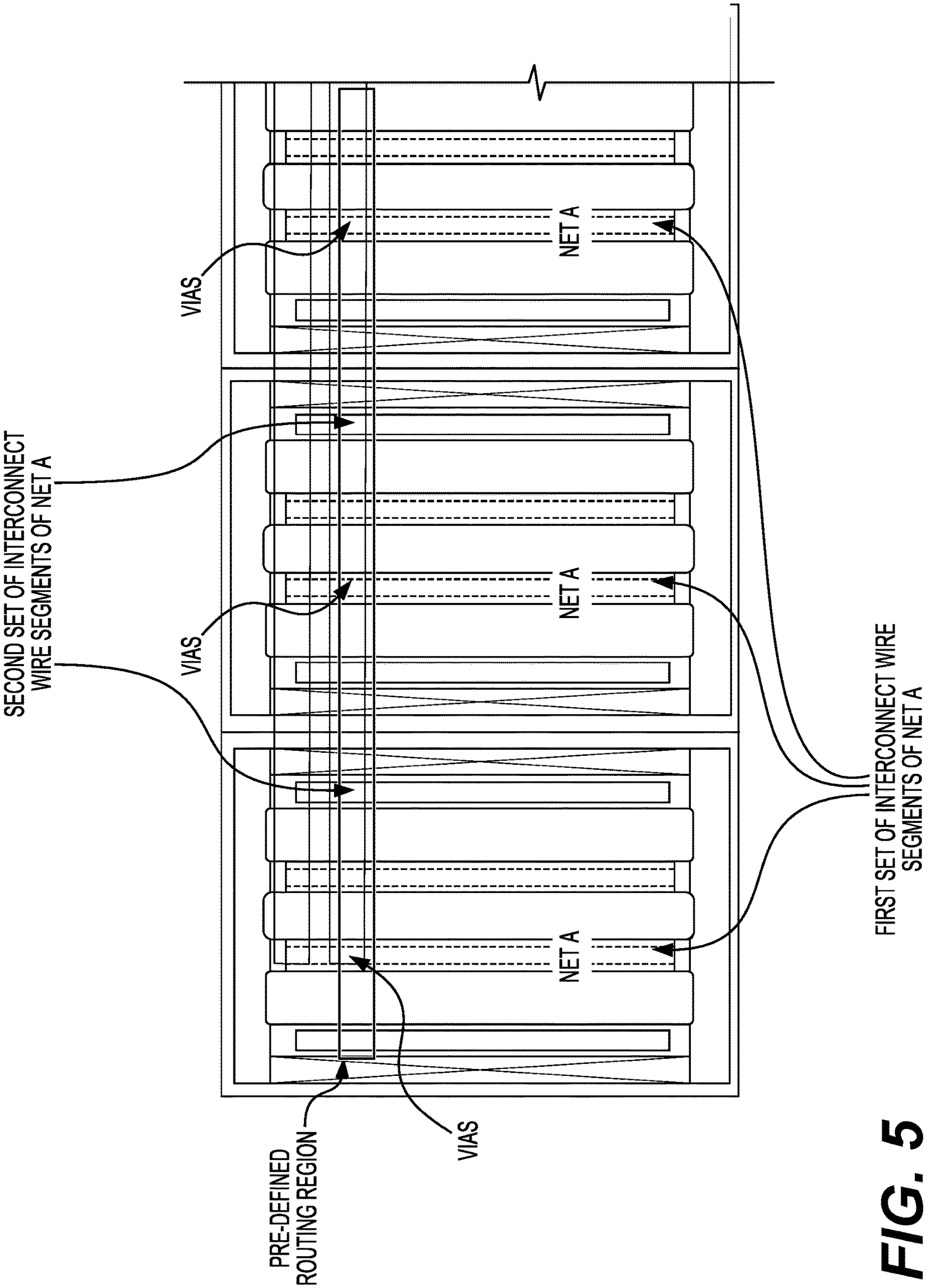
FIG. 5 depicts a non-limiting example of a second set of interconnect wire segments that connect all of the interconnect wire segments in the first set via a plurality of vias in accordance with some embodiments.

In the example of FIG. 1, the interconnect routing component 110 is configured to automatically connect the first set of interconnect wire segments by creating and routing a second set of one or more interconnect wire segments along the tracks in the pre-defined routing region, wherein each interconnect wire segment in the second set connects two or more the interconnect wire segments in the first set following various routing constraints e.g., WSP, of the pre-defined routing region. In some embodiments, the interconnect routing component 110 is configured to utilize one or more vias to connect each interconnect wire segment in the second set to connect with the two or more interconnect wire segments in the first set, wherein the first set and the second set of interconnect wire segments are routed on different (e.g., metal or polysilicon) layers. In some embodiments, the interconnect routing component 110 is configured to connect two or more interconnect wire segments in the first set using one interconnect wire segment in the second set with two or more vias connecting the respective interconnect wire segments in the two sets. FIG. 5 depicts a non-limiting example of a second set of interconnect wire segments in routing region #b that connect all of the interconnect wire segments in the first set via a plurality of vias. In some embodiments, the interconnect routing component 110 is configured to connect only a subset of the interconnect wire segments in the first set of interconnect wire segments via the second set of interconnect wire segments. For non-limiting examples, in some embodiments, the interconnect routing component 110 is configured to sort the first set of interconnect wire segments in a certain order (e.g., from left to right or top to bottom in the layout) and only connect the odd-numbered or even-numbered interconnect wire segments in the first set together. In some embodiments, the interconnect routing component 110 is configured to sort and only connect only the leftmost and the rightmost (or the topmost and the bottommost) interconnect wire segments in the first set together while skipping other interconnect wire segments in between. In some embodiments, the interconnect routing component 110 is configured to connect only the interconnect wire segments in the first set that are within a certain physical range/region in the layout together. In some embodiments, the interconnect routing component 110 is configured to connect only a user-specified subset of the first set of interconnect wire segments together via the second set of interconnect wire segments.

Once the first set of interconnect wire segments has been connected by the second set of interconnect wire segments, the layout display component 106 of the graphic-based layout editor 104 is configured to present the layout including the second set of interconnect wire segments and the vias connecting the first and the second sets of interconnect wire segments. In some embodiments, the region and interconnect identification component 108 is configured to update and save the updated layout as well as the metadata of the second set of interconnect wire segments, e.g., widths, spacing and routing patterns, of the interconnect wire segments to the layout database 112.

Figure 6:
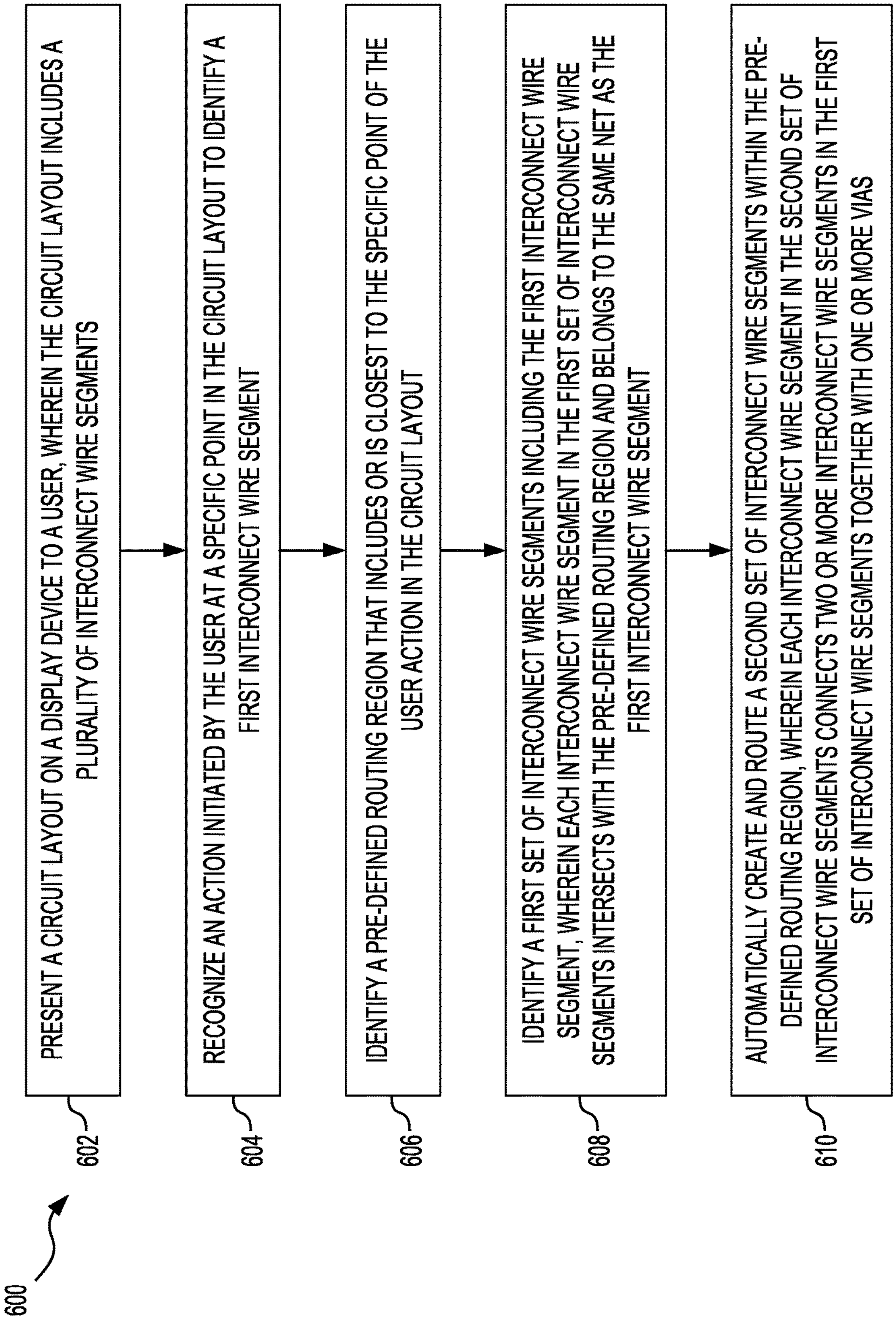
FIG. 6 depicts an example of a flowchart of a process to support automatic same net interconnect wire segment identification and connection in accordance with some embodiments.

FIG. 6 depicts an example of a flowchart of a process to support automatic same net interconnect wire segment identification and connection. Although this figure depicts functional steps in a particular order for purposes of illustration, the process is not limited to any particular order or arrangement of steps. One skilled in the relevant art will appreciate that the various steps portrayed in this figure could be omitted, rearranged, combined and/or adapted in various ways.

In the example of FIG. 6, the flowchart 600 starts at block 602, where a circuit layout is presented on a display device to a user, wherein the circuit layout includes a plurality of interconnect wire segments. The flowchart 600 continues to block 604, where an action initiated by the user at a specific point in the layout is recognized to identify a first interconnect wire segment. The flowchart 600 continues to block 606, where a pre-defined routing region that includes or is closest to the specific point of the user action in the circuit layout is identified. The flowchart 600 continues to block 608, where a first set of interconnect wire segments including the first interconnect wire segment is identified, wherein each interconnect wire segment in the first set of interconnect wire segments intersects with the pre-defined routing region and belongs to the same net as the first interconnect wire segment. The flowchart 600 ends at block 610, where a second set of interconnect wire segments are automatically created and routed within the pre-defined routing region, wherein each interconnect wire segment in the second set of interconnect wire segments connects two or more interconnect wire segments in the first set of interconnect wire segments together with one or more vias.

One embodiment may be implemented using a conventional general purpose or a specialized digital computer or microprocessor(s) programmed according to the teachings of the present disclosure, as will be apparent to those skilled in the computer art. Appropriate software coding can readily be prepared by skilled programmers based on the teachings of the present disclosure, as will be apparent to those skilled in the software art. The invention may also be implemented by the preparation of integrated circuits or by interconnecting an appropriate network of conventional component circuits, as will be readily apparent to those skilled in the art.

One embodiment includes a computer program product which is a machine readable medium (media) having instructions stored thereon/in which can be used to program one or more hosts to perform any of the features presented herein. The machine readable medium can include, but is not limited to, one or more types of disks including floppy disks, optical discs, DVDs, CD-ROMs, micro drives, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data. Stored on any one of the computer readable mediums (media), the present invention includes software for controlling both the hardware of the general purpose/specialized computer or microprocessor, and for enabling the computer or microprocessor to interact with a human viewer or other mechanism utilizing the results of the present invention. Such software may include, but is not limited to, device drivers, operating systems, execution environments/containers, and applications.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Particularly, while the concept "component" is used in the embodiments of the systems and methods described above, it will be evident that such concept can be interchangeably used with equivalent concepts, such as class, method, type, interface, module, object model, and other suitable concepts. Embodiments were chosen and described in order to best describe the principles of the invention and its practical application, thereby enabling others skilled in the relevant art to understand the claimed subject matter, the various embodiments, and the various modifications that are suited to the particular use contemplated.

What is claimed is:

1. A system to support same net interconnect wire segment identification and connection, comprising:

a graphic-based layout editing tool running on a host, which in operation, is configured to:

present a circuit layout on a display device to a user, wherein the circuit layout includes a plurality of interconnect wire segments;

recognize an action initiated by the user at a specific point in the circuit layout to identify a first interconnect wire segment;

identify a pre-defined routing region that includes or is closest to the specific point of the user action in the circuit layout;

identify a first set of interconnect wire segments including the first interconnect wire segment, wherein each interconnect wire segment in the first set of interconnect wire segments intersects with the pre-defined routing region and belongs to the same net as the first interconnect wire segment; and automatically create and route a second set of interconnect wire segments within the pre-defined routing region, wherein each interconnect wire segment in the second set of interconnect wire segments connects two or more interconnect wire segments in the first set of interconnect wire segments together with one or more vias.

2. The system of claim 1, further comprising:

a layout database configured to maintain metadata associated with each of the plurality of interconnect wire segments in the circuit layout.

3. The system of claim 2, wherein:

the metadata associated with each of the plurality of interconnect wire segments includes one or more of name, number, identifier or id, and geometric properties of a layout object as well as its connections to other interconnect wire segments.

4. The system of claim 1, wherein:

the user action is initiated by the user via an input device of the host or by moving his/her finger across a touch screen of the host.

5. The system of claim 1, wherein:

the pre-defined routing region includes one or more tracks of certain width, spacing and pattern (WSP), wherein the pattern includes one or more properties and/or masks for a certain routing layer that can be utilized to connect the first interconnect wire segment with the rest of the interconnect wire segments that belong to the same net.

6. The system of claim 1, wherein:

the graphic-based layout editing tool is configured to identify the first set of interconnect wire segments from the same net that intersect with the pre-defined routing region by utilizing information, net assignment, and/or location of the first set of interconnect wire segments.

7. The system of claim 1, wherein:

the graphic-based layout editing tool is configured to recognize a directional cursor movement within the pre-defined region and identify the first set of interconnect wire segments that intersect with the directional cursor movement.

8. The system of claim 1, wherein:

the graphic-based layout editing tool is configured to connect two or more interconnect wire segments in the first set of interconnect wire segments using one interconnect wire segment in the second set of interconnect wire segments with two or more vias connecting the respective interconnect wire segments in the two sets.

9. The system of claim 1, wherein:

the graphic-based layout editing tool is configured to connect only a subset of the interconnect wire segments in the first set of interconnect wire segments via the second set of interconnect wire segments.

10. The system of claim 2, wherein:

the graphic-based layout editing tool is configured to update and save the updated layout as well as the metadata of the second set of interconnect wire segments to the layout database.

11. A computer-implemented method to support same net interconnect wire segment identification and connection, comprising:

presenting a circuit layout on a display device to a user, wherein the circuit layout includes a plurality of interconnect wire segments;

recognizing an action initiated by the user at a specific point in the circuit layout to identify a first interconnect wire segment;

identifying a pre-defined routing region that includes or is closest to the specific point of the user action in the circuit layout;

identifying a first set of interconnect wire segments including the first interconnect wire segment, wherein each interconnect wire segment in the first set of interconnect wire segments intersects with the predefined routing region and belongs to the same net as the first interconnect wire segment; and automatically creating and routing a second set of interconnect wire segments within the pre-defined routing region, wherein each interconnect wire segment in the second set of interconnect wire segments connects two or more interconnect wire segments in the first set of interconnect wire segments together with one or more vias.

12. The computer-implemented method of claim 11, further comprising:

maintaining metadata associated with each of the plurality of interconnect wire segments in the circuit layout in a layout database, wherein the metadata associated with each of the plurality of interconnect wire segments includes one or more of name, number, identifier or id, and geometric properties of a layout object as well as its connections to other interconnect wire segments.

13. The computer-implemented method of claim 11, wherein:

the user action is initiated by the user via an input device of a host or by moving his/her finger across a touch screen of the host.

14. The computer-implemented method of claim 11, wherein:

the pre-defined routing region includes one or more tracks of certain width, spacing and pattern (WSP), wherein the pattern includes one or more properties and/or masks for a certain routing layer that can be utilized to connect the first interconnect wire segment with the rest of the interconnect wire segments that belong to the same net.

15. The computer-implemented method of claim 11, wherein:

identifying the first set of interconnect wire segments from the same net that intersect with the pre-defined routing region by utilizing information, net assignment, and/or location of the first set of interconnect wire segments.

16. The computer-implemented method of claim 11, further comprising:

recognizing a directional cursor movement within the pre-defined region and identify the first set of interconnect wire segments that intersect with the directional cursor movement.

17. The computer-implemented method of claim 11, further comprising:

connecting two or more interconnect wire segments in the first set of interconnect wire segments using one interconnect wire segment in the second set of interconnect wire segments with two or more vias connecting the respective interconnect wire segments in the two sets.

18. The computer-implemented method of claim 11, further comprising:

connecting only a subset of the interconnect wire segments in the first set of interconnect wire segments via the second set of interconnect wire segments.

19. The computer-implemented method of claim 12, further comprising:

updating and saving the updated layout as well as the metadata of the second set of interconnect wire segments to the layout database.

20. A non-transitory computer readable storage medium having software instructions stored thereon that when executed cause a system to:

present a circuit layout on a display device to a user, wherein the circuit layout includes a plurality of interconnect wire segments;

recognize an action initiated by the user at a specific point in the circuit layout to identify a first interconnect wire segment;

identify a pre-defined routing region that includes or is closest to the specific point of the user action in the circuit layout;

identify a first set of interconnect wire segments including the first interconnect wire segment, wherein each interconnect wire segment in the first set of interconnect wire segments intersects with the pre-defined routing region and belongs to the same net as the first interconnect wire segment; and automatically create and route a second set of interconnect wire segments within the pre-defined routing region, wherein each interconnect wire segment in the second set of interconnect wire segments connects two or more interconnect wire segments in the first set of interconnect wire segments together with one or more vias.

* * * * *